(12) United States Patent
Low et al.

(10) Patent No.: US 9,813,064 B2
(45) Date of Patent: Nov. 7, 2017

(54) APPARATUS FOR HIGH VOLTAGE TOLERANT DRIVER

(71) Applicants: Chia How Low, Simpang Ampat (MY); Chee Seng Leong, Wilayah Persekutuan (MY); Yick Yaw Ho, Folsom, CA (US)

(72) Inventors: Chia How Low, Simpang Ampat (MY); Chee Seng Leong, Wilayah Persekutuan (MY); Yick Yaw Ho, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 881 days.

(21) Appl. No.: 14/109,484

(22) Filed: Dec. 17, 2013

(65) Prior Publication Data

US 2015/0171830 A1    Jun. 18, 2015

(51) Int. Cl.
*H03K 3/01* (2006.01)
*H03K 19/0175* (2006.01)
*H03K 3/011* (2006.01)

(52) U.S. Cl.
CPC ..... *H03K 19/017581* (2013.01); *H03K 3/011* (2013.01); *Y10T 307/305* (2015.04)

(58) Field of Classification Search
CPC ............ H03K 19/017581; H03K 3/011; Y10T 307/305
See application file for complete search history.

(56) References Cited

U.S. PATENT DOCUMENTS

| | | | | |
|---|---|---|---|---|
| 6,972,596 B1 * | 12/2005 | Proebsting | ............. | H03K 5/003 326/34 |
| 8,896,354 B1 * | 11/2014 | Hong | ................. | H03K 19/0016 327/108 |
| 2010/0097117 A1 * | 4/2010 | Wang | ............... | H03K 3/356113 327/333 |
| 2013/0162044 A1 * | 6/2013 | Mangattur | ............ | G06F 1/3287 307/64 |
| 2013/0278296 A1 * | 10/2013 | Amirkhany | ...... | H03K 19/00315 327/108 |

FOREIGN PATENT DOCUMENTS

EP    0717334 A2 *    6/1996    ............. G05F 3/205

* cited by examiner

*Primary Examiner* — Jared Fureman
*Assistant Examiner* — Emmanuel R Dominique
(74) *Attorney, Agent, or Firm* — Blakely, Sokoloff, Taylor & Zafman LLP

(57) ABSTRACT

Described is an apparatus which comprises: a first power supply; a second power supply lower than the first power supply; first and second transistors coupled in series and to be biased, the first and second transistors coupled to a pad; a first pull-up transistor coupled to the first power supply and to one of the first or second transistors; a pull-down transistor coupled to one of the first or second transistors; and a second pull-up transistor coupled to the second power supply, the pull-down transistor, and to one of the first or second transistors.

20 Claims, 5 Drawing Sheets

APPARATUS FOR HIGH VOLTAGE TOLERANT DRIVER

BACKGROUND

Electrical overstress (EOS) is a challenge for legacy input-output (I/O) buffers that are required to operate either on a high power supply (e.g., 3.3V) for backward compatibility or on a low power supply (e.g., 1V) for next generation low power applications. For example, Universal Serial Bus (USB) 2.0 compliant I/O buffer is required to offer functionality in classical (CL) mode in which signals are driven by the buffer using 3.3V power supply, and also required to offer functionality in high speed (HS) mode in which signals are driven by the buffer using 1.0V power supply. For the buffer to provide functionality for both modes of operation, dual buffer designs are used which increase area and power.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
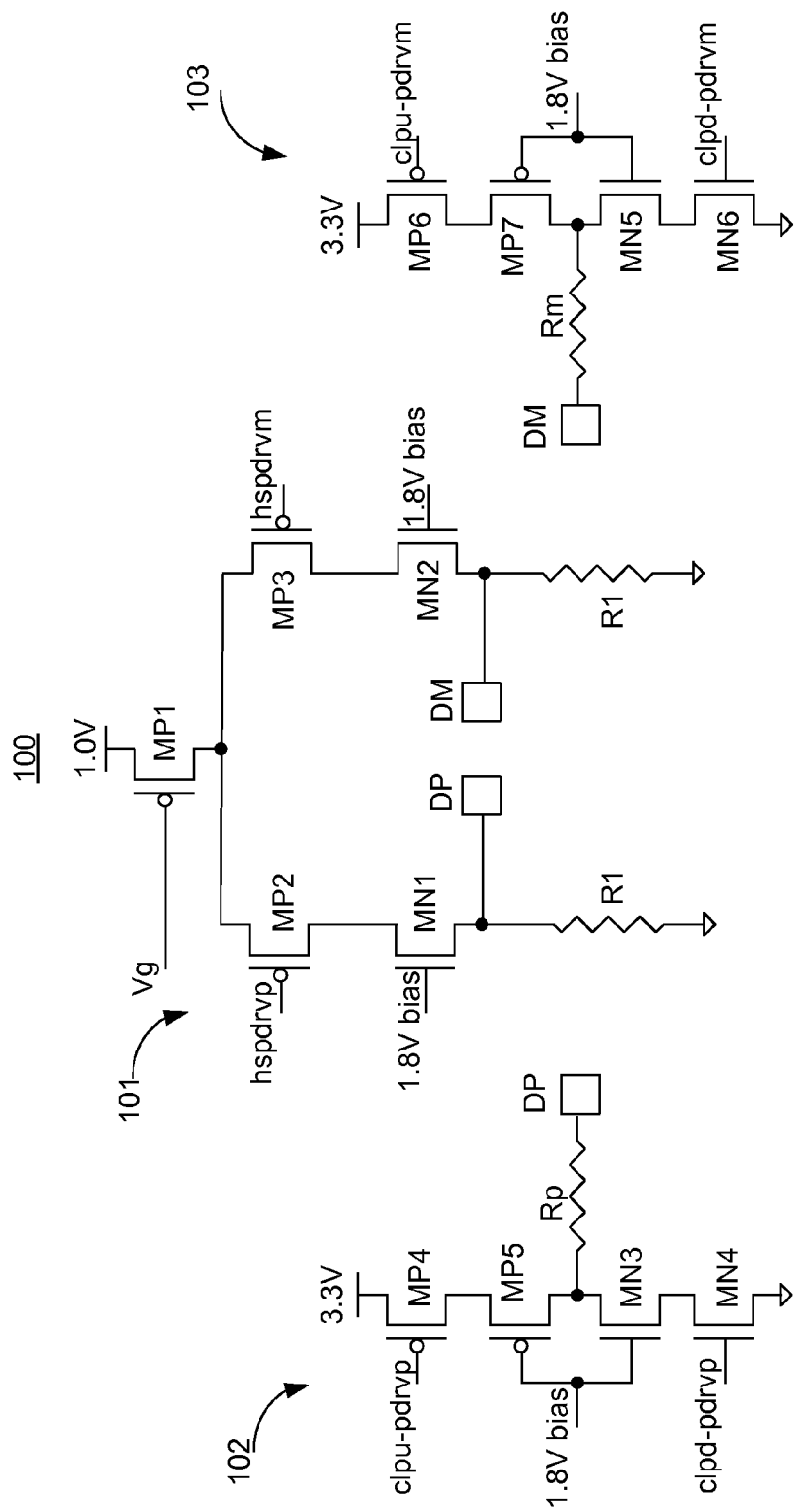
FIG. 1 illustrates a generic transmitter driver with two different buffers for high voltage and low voltage operations.

FIG. 1 illustrates a generic transmitter driver 100 with two different buffers for high voltage and low voltage operations. Here, driver 100 includes a high speed (HS) driver 101 that operates on low power supply (e.g., 1V), and classic (CL) drivers 102 and 103. CL drivers 102 and 103 operate on legacy power supply (e.g., 3.3V) which is higher power supply than the power supply to HS driver 101.

HS driver 101 consists of p-type transistors MP1, MP2, and MP3, n-type transistors MN1, MN2, and pull-down resistors R1 coupled together as shown. MP1 is the current source biased by Vg. MP1 has a source terminal coupled to the low power supply (e.g., 1V). MP2 and MP3 are the pull-up drivers controllable by hspdrvp and hspdrvm signals respectively. MN1 and MN2 are pass gates that are biased by 1.8V bias voltage. The output of HS driver 101 is a low swing differential output on pads DP and DM.

CL driver 102 consists of p-type transistors MP4 and MP5, and n-type transistors MN3 and MN4 coupled together in series. Source terminal of MP4 is coupled to a high power supply (e.g., 3.3V). MP5 and MN3 are biased, for example, by a 1.8V bias. MP4 is controllable by clpu-pdrvp while MN4 is controllable by clpd-pdrvp. The output of CL driver 102 is coupled to drain terminals of MP5 and MN3. The drain terminals of MP5 and MN3 are coupled to resistor Rp which is coupled to pad DP.

CL driver 103 consists of p-type transistors MP6 and MP7, and n-type transistors MN5 and MN6 coupled together in series. Source terminal of MP6 is coupled to a high power supply (e.g., 3.3V). MP7 and MN5 are biased, for example, by a 1.8V bias. MP6 is controllable by clpu-pdrvm while MN6 is controllable by clpd-pdrvm. The output of CL driver 103 is coupled to drain terminals of MP7 and MN5. The drain terminals of MP7 and MN5 are coupled to resistor Rm which is coupled to pad DM. Here, DP and DM form the differential output for the CL drivers 102 and 103. When CL drivers 102 and 103 are enabled, HS driver 101 is disabled, and visa versa.

Current USB 2.0 compliant I/O buffers have drivers of FIG. 1. CL pull-down driver MN4 and MN6 are always turned ON during HS operation to provide an effective termination (e.g., 45Ω) to ground. Both CL and HS drivers share single I/O pad (i.e., pad coupled to DP and DM) and hence, EOS (electrical over stress) protection pass gates are used for both CL and HS drivers. Additional transistor MN1, MN2, MN3, MN5, MP5 and MP7 are added and are always turned ON to provide EOS safe condition as USB2.0 CL mode operates with 3.3V signaling.

For driver 100, the performance of HS driver 101 degrades by MN1 and MN2 EOS protection pass gates and switches MP2 and MP3. The current steering MP1 current source also faces headroom issues which forces transistors MN1, MN2, MP2 and MP3 to be sized up significantly to reduce the IR drop. As a result, the USB 2.0 TX (transmitter) size that uses driver 100 is large and consumes high power.

The embodiments describe a driver which comprises: a first pull-up transistor coupled to a first power supply (e.g., 3.3V). In one embodiment, the first pull-up transistor is controllable by a first pre-driver. In one embodiment, the driver further comprises a second pull-up transistor coupled to a second power supply (e.g., 1V). In one embodiment, the second pull-up transistor is controllable by a second pre-driver. In one embodiment, first and second transistors are coupled in series and are biased to provide EOS protection to the devices of the driver. In one embodiment, the first and second transistors are coupled to a pad. In one embodiment, the first and second transistors separate the first pull-up transistor from the second pull-up transistor, where the first pull-down transistor is coupled to the second pull-up transistor. In one embodiment, the second pull-up transistor is used for HS mode, while the first pull-up transistor is used for CL mode.

In one embodiment, by adding the second pull-up transistor to CL driver (e.g., 102 and/or 103), high voltage (i.e., legacy) driver mode is enabled along with low voltage driver mode. In the embodiments, the second pull-up transistor replaces HS driver 101, thus reducing area and power, such the new driver (e.g., driver 200 in FIG. 2) can operate using high power supply and low power supply. In one embodiment, all n-type transistors have their bulk or substrate terminals coupled to ground. In one embodiment, all p-type transistors have their bulk or substrate terminals coupled to the first power supply (e.g., 3.3V) except for the second pull-up transistor which has its bulk terminal coupled to a bias supply.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
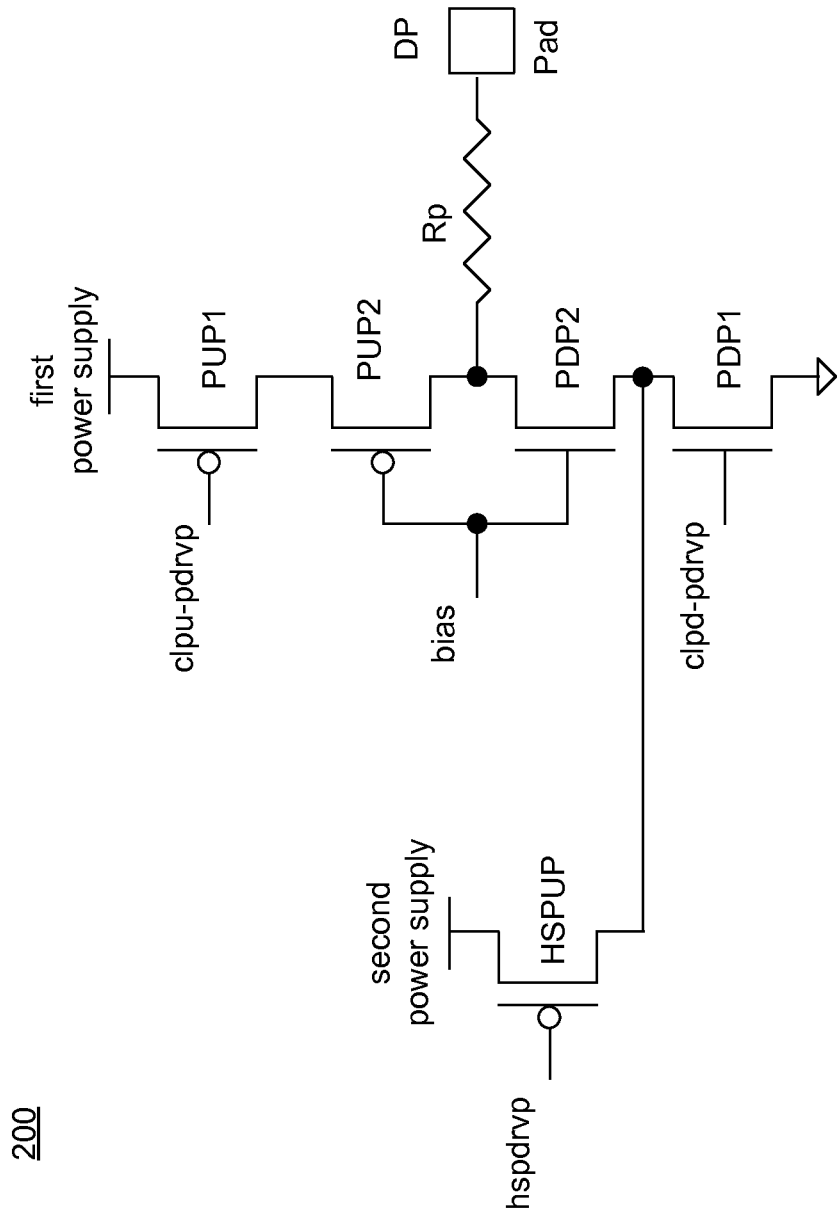
FIG. 2 illustrates a high voltage tolerant driver, according to one embodiment of the disclosure.

FIG. 2 illustrates a high voltage tolerant driver 200, according to one embodiment of the disclosure. It is pointed out that those elements of FIG. 2 having the same reference numbers (or names) as the elements of any other figure can operate or function in any manner similar to that described, but are not limited to such.

In one embodiment, driver 200 is a voltage mode driver as opposed to current mode driver 100. In one embodiment, driver 200 comprises p-type devices PUP1, PUP2, and HSPUP; and n-type devices PDP2 and PDP1. Here, PUP1 is also referred as the first pull-up driver, PDP1 is referred as the pull-down driver, and HSPUP is referred as the second pull-up driver. In one embodiment, PUP1, PUP2, PDP2, and PDP1 are coupled together in series such that source terminal of PUP1 is coupled to first power supply (e.g., 3.3V) and the source terminal of PDP1 is coupled to ground. In one embodiment, source terminal of HSPUP is coupled to second power supply (e.g., 0.5V-1.2V) while its drain terminal is coupled to the drain terminal of PDP1 and source terminal of PDP2.

While the embodiments are explained with reference to USB 2.0 compliant I/O driver, the embodiments can apply to any driver that uses two different power supplies and signaling specifications while providing EOS protection to its devices.

In one embodiment, gate terminals of PUP2 and PDP2 are biased by bias. In one embodiment, bias is 1.8V. In other embodiments, other values for bias may be used. In one embodiment, bias is generated by a bias generator (not shown). In one embodiment, drain terminals of PUP2 and PDP2 are coupled to resistor Rp which is coupled to pad DP. In one embodiment, resistor Rp is driver impedance (e.g., USB2 driver impedance for meeting linearity specifications). In one embodiment, Rp/Rm is on-die precision resistor (e.g., poly resistor) to improve impedance linearity of the driver. A MOS only driver may not provide linear impedance from 0.0V to 3.3V.

In one embodiment, gate terminal of PDP1 is controlled by clpd-pdrvp, which is generated by a pre-driver. In one embodiment, gate terminal of PUP1 is controlled by clpu-pdrvp, which is generated by another pre-driver. In one embodiment, gate terminal of HSPUP is controlled by hspdrvp, which is generated by a pre-driver. While clpd-pdrvp, clpu-pdrvp, and hspdrvp are described as being generated by different pre-drivers, they may be generated by one pre-driver having additional logic to output the three different signal types, according to one embodiment.

In one embodiment, HSPUP, PDP1, and PDP2 together form the HS driver for low voltage low power driver operation. In one embodiment, PUP1, PDP2, PDP2, and PDP1 together form the CL driver for high voltage (i.e., legacy mode) driver operation. In this embodiment, both HS and CL drivers share the same pull-down driver PDP1. In one embodiment, PDP2 is sized up (i.e., has larger W/L than traditional MN3 or MN5 transistors) to reduce its resistance when driver 200 is operating in HS mode.

In one embodiment, PDP2 provides EOS protection for HSPUP and PDP1. In one embodiment, no additional EOS protection pass gate may be needed by the HS mode driver. In one embodiment, PDP1 has a smaller size compared to traditional pull-down devices while still having the ability to be compensated for process, temperature, and voltage variations. In one embodiment, the total pull-down resistance for driver 200 is the sum of resistances of PDP1 and PDP2. In one embodiment, Rp and Rm is part of the driver and are used to meet the impedance linearity target. Rp and Rm may contribute to a major portion of the total driver impedance (e.g., almost 70-80% in total driver impedance). In one embodiment, all the transistors for driver 200 are 1.8V thick-gate transistors so transition ring or level-shifting may not be used.

Figure 3:
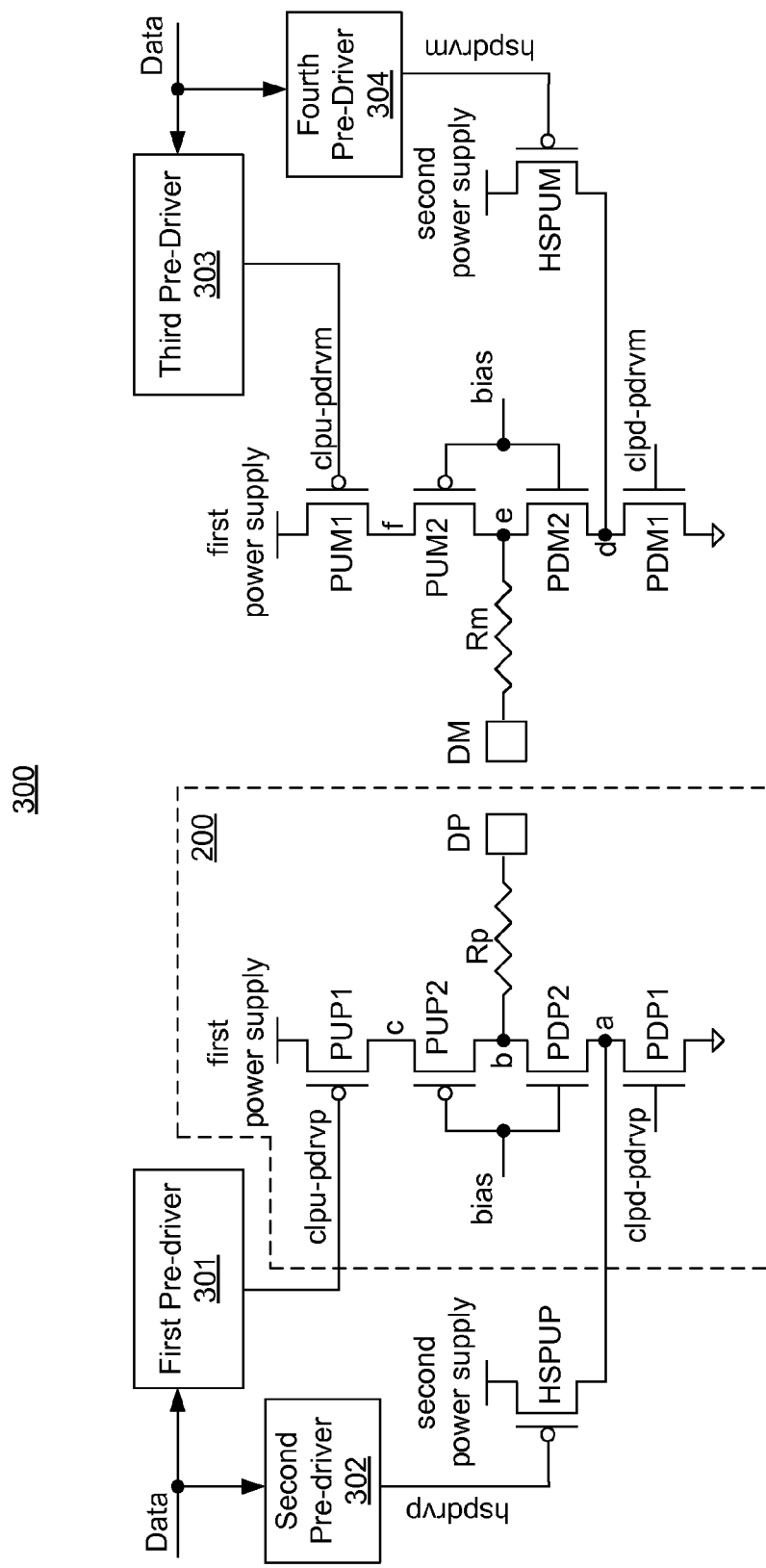
FIG. 3 illustrates a high voltage tolerant differential driver, according to one embodiment of the disclosure.

FIG. 3 illustrates a high voltage tolerant differential driver 300, according to one embodiment of the disclosure. It is pointed out that those elements of FIG. 3 having the same reference numbers (or names) as the elements of any other figure can operate or function in any manner similar to that described, but are not limited to such.

In one embodiment, differential driver 300 comprises two sets of driver 200 providing differential signals DP and DM. In one embodiment, differential driver 300 comprises First Pre-driver 301, Second Pre-driver 302, driver 200, Third Pre-driver 303, Fourth Pre-Driver 304, and another instance of driver 200. In one embodiment, the other instance of driver 200 includes p-type devices PUM1, PUM2, and HSPUM; and n-type devices PDM2 and PDM1. Here, PUM1 is also referred as the third pull-up driver, PDM1 is referred as the second pull-down driver, and HSPUM is referred as the fourth pull-up driver. Here, PDP1 is also referred as the first pull-down driver. In one embodiment, PUM1, PUM2, PDM2, and PDM1 are coupled together in series such that source terminal of PUM1 is coupled to the first power supply (e.g., 3.3V) and the source terminal of PDM1 is coupled to ground. In one embodiment, source terminal of HSPUM is coupled to the second power supply (e.g., 0.5V-1.2V) while its drain terminal is coupled to the drain terminal of PDM1 and source terminal of PDM2.

In one embodiment, First Pre-driver 301, Second Pre-driver 302, Third Pre-driver 303, and Fourth Pre-Driver 304 receive Data for transmission and generate clpu-pdrvp, hspdrvp, clpu-pdrvm, and hspdrvm respectively. In one embodiment, another set of Pre-drivers are used to generate clpd-pdrvp and cpld-pdrvm.

In one embodiment, during CL mode, the HS pull-up driver (HSPUP and HSPUM) is disabled. In one embodiment, to transmit in USB 2.0 CL 3.3V signaling mode, driver 300 operates like a regular high voltage CMOS driver, pulling up or down with driver impedance compensated to 45Ω, for example. In one embodiment, both cascode p-type devices (i.e., PUP2 and/or PUM2) and n-type devices (i.e., PDP2 and/or PDM2) are always turned ON for EOS protection.

In one embodiment, during HS mode, the CL pull up driver (i.e., PUP1 and PUM1) is disabled. In one embodiment, to transmit HS '0' at DP, the HS pull up driver (i.e., HSPUP) is turned OFF (e.g., by 1.8V gate voltage) while first pull down driver (i.e., PDP1) is turned ON (e.g., by 1.8V gate voltage). In such an embodiment, nodes 'a,' 'b,' and DP are pulled to 0V. In one embodiment, to transmit HS '1' at DM, the second pull down driver (i.e., PDM1) is turned OFF by 0V gate voltage while HS fourth pull up driver (i.e., HSPUM) is turned ON by 0V gate voltage. In such an embodiment, nodes 'd' and 'e' are pulled to approximately 1V, for example. In this example, since the device with 45Ω termination to ground is coupled to the pad, DM is divided to approximately 0.5V which satisfies USB 2.0 HS signaling specification.

Figure 4:
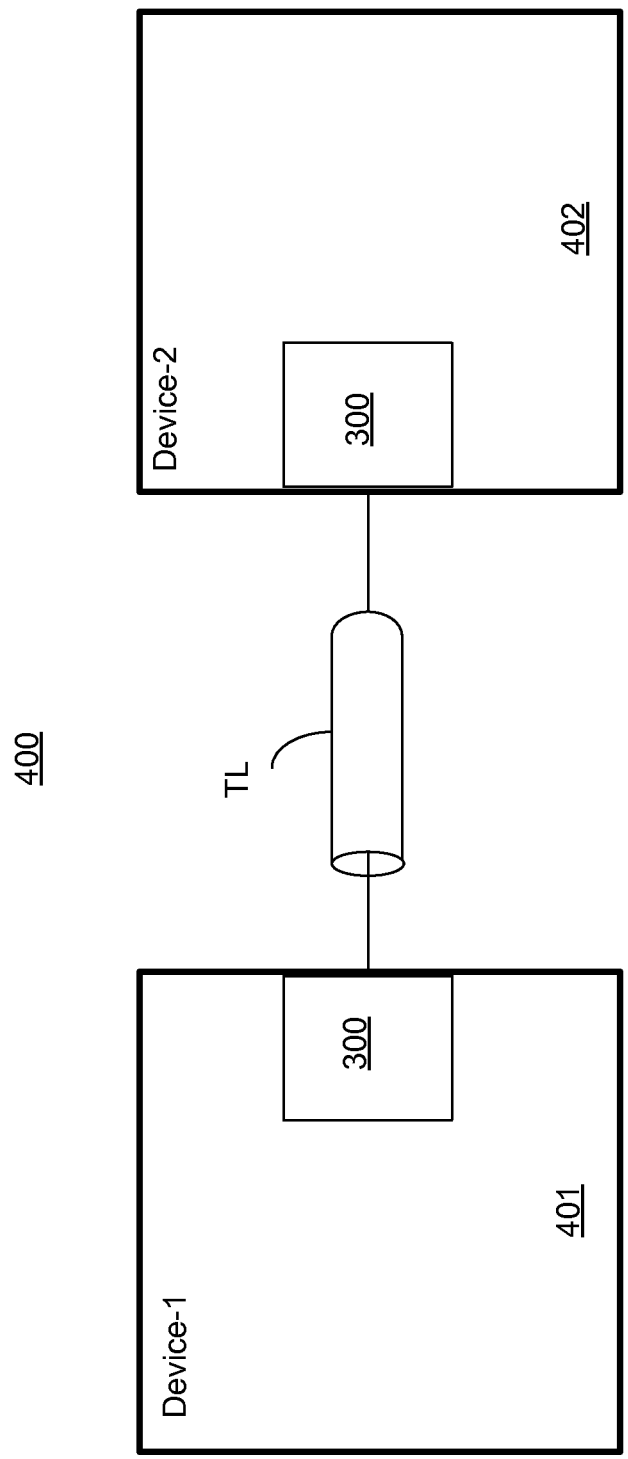
FIG. 4 illustrates an input-output (I/O) system using the high voltage tolerant driver, according to one embodiment of the disclosure.

FIG. 4 illustrates an input-output (I/O) system 400 using the high voltage tolerant driver, according to one embodiment of the disclosure. It is pointed out that those elements of FIG. 4 having the same reference numbers (or names) as the elements of any other figure can operate or function in any manner similar to that described, but are not limited to such. In one embodiment, system 400 comprises a first device (Device-1) 401, second device (Device-2) 402, and transmission line TL coupling devices 401 and 402. In one embodiment, each device has a differential buffer 300.

Figure 5:
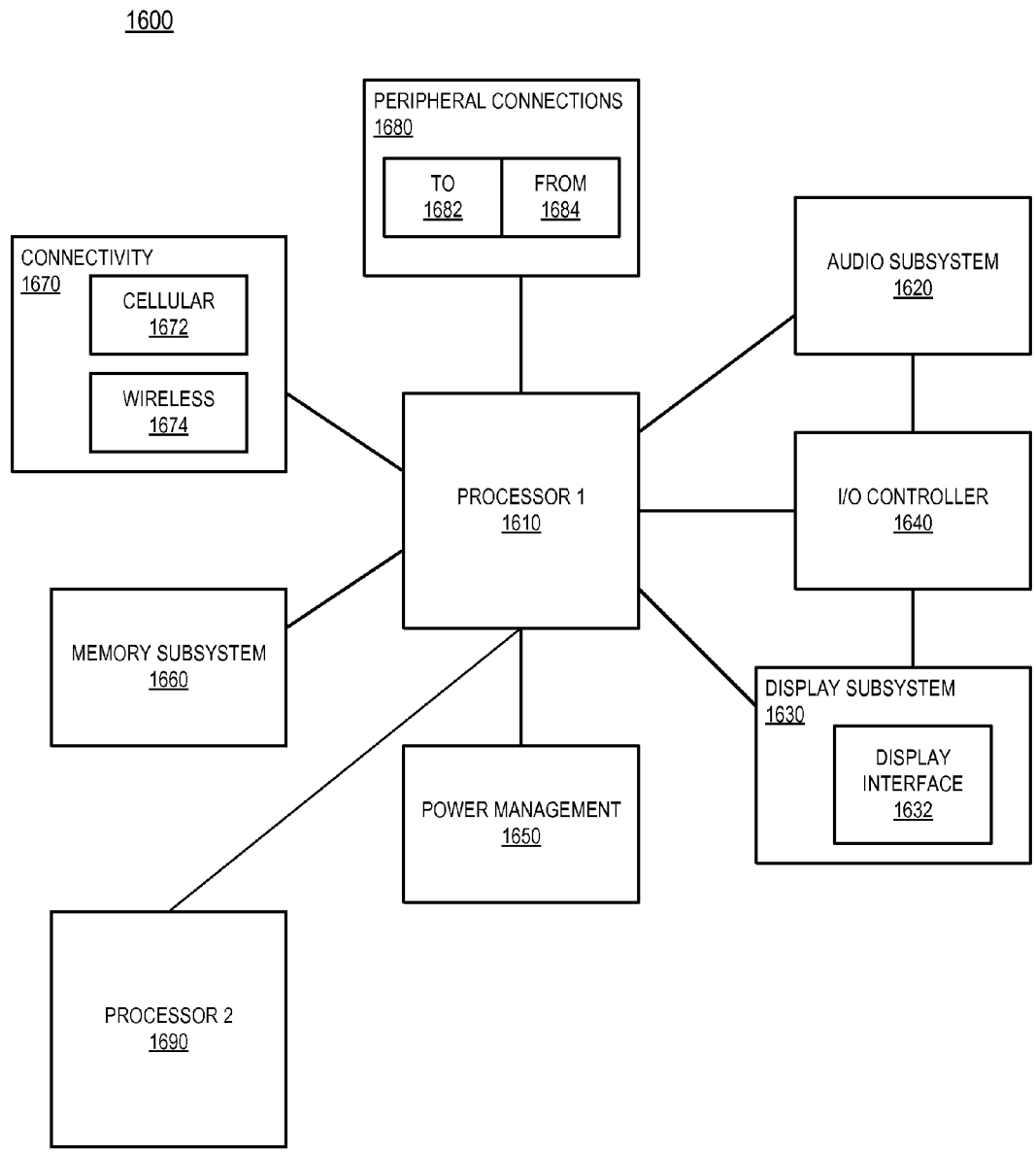
FIG. 5 is a smart device or a computer system or an SoC (System-on-Chip) with high voltage tolerant driver, according to one embodiment of the disclosure.

FIG. 5 is a smart device or a computer system or an SoC (System-on-Chip) with high voltage tolerant driver, according to one embodiment of the disclosure. It is pointed out that those elements of FIG. 5 having the same reference numbers (or names) as the elements of any other figure can operate or function in any manner similar to that described, but are not limited to such.

FIG. 5 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with high voltage tolerant driver described with reference to embodiments. Other blocks of the computing device 1600 may also include high voltage tolerant driver described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus is provided which comprises: a first power supply; a second power supply lower than the first power supply; first and second transistors coupled in series and to be biased, the first and second transistors coupled to a pad; a first pull-up transistor coupled to the first power supply and to one of the first or second transistors; a pull-down transistor coupled to one of the first or second transistors; and a second pull-up transistor coupled to the second power supply, the pull-down transistor, and to one of the first or second transistors.

In one embodiment, the second pull-up transistor is operable to be turned off in a first mode of operation in which the first pull-up transistor is turned on. In one embodiment, the second pull-up transistor is operable to be turned on in a second mode of operation in which the first pull-up transistor is turned off. In one embodiment, the first transistor and the first pull-up transistor are p-type devices. In one embodiment, the second transistor and the pull-down transistor are n-type devices. In one embodiment, the first power supply is substantially 3.3V and the second power supply is in the range of 0.5V to 1.2V. In one embodiment, the second pull-up transistor is a p-type device.

In another example, a driver is provided which comprises: a first pull-up transistor coupled to a first power supply, the first pull-up transistor controllable by a first pre-driver; a second pull-up transistor coupled to a second power supply, the second pull-up transistor controllable by a second pre-driver; first and second transistors coupled in series and to be biased, the first and second transistors coupled to a pad, the first and second transistors separating the first pull-up transistor from the second pull-up transistor; and a first pull-down transistor coupled to the second pull-up transistor.

In one embodiment, the second pull-up transistor is operable to be turned off in a first mode of operation in which the first pull-up transistor is turned on. In one embodiment, the second pull-up transistor is operable to be turned on in a second mode of operation in which the first pull-up transistor is turned off. In one embodiment, the first power supply is greater than the second power supply. In one embodiment, the first pull-up transistor, second pull-up transistor, first and second transistors, and first pull-down transistor are part of a USB transmitter.

In one embodiment, the driver further comprises: a third pull-up transistor coupled to the first power supply, the third pull-up transistor controllable by a third pre-driver; a fourth pull-up transistor coupled to the second power supply, the fourth pull-up transistor controllable by a fourth pre-driver; third and fourth transistors coupled in series and to be biased, the third and fourth transistors coupled to the pad, the third and fourth transistors separating the third pull-up transistor from the fourth pull-up transistor; and a second pull-down transistor coupled to the second pull-up transistor.

In one embodiment, the first and third pull-up transistors, second and fourth pull-up transistors, first, second, third, and fourth transistors, and first and second pull-down transistors are part of a differential USB transmitter. In one embodiment, the first power supply is substantially 3.3V and the second power supply is in the range of 0.5V to 1.2V.

In another example, a system is provided which comprises: a memory; a processor coupled to the memory, the processor having a USB compliant transmitter, the USB compliant transmitter comprising an apparatus according to the apparatus discussed above. In one embodiment, the system further comprises a wireless interface for allowing the processor to communicate with another device. In one embodiment, the system further comprises a display unit. In one embodiment, the display unit is a touch screen.

In another example, a system is provided which comprises: a memory; a processor coupled to the memory, the processor having a USB compliant transmitter, the USB compliant transmitter comprising a driver according to the driver discussed above. In one embodiment, the system further comprises a wireless interface for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first power supply;
   a second power supply lower than the first power supply;
   first and second transistors coupled in series and coupled to a bias signal and a pad;
   a first pull-up transistor coupled to the first power supply and to the first transistor;
   a pull-down transistor coupled to the second transistor; and
   a second pull-up transistor coupled to the second power supply, the pull-down transistor, and to the second transistor, wherein the first pull-up transistor, the first and second transistors and the pull-down transistor form a first driver to operate in a first mode of operation, and the second pull-up transistor, the pull-down transistor and the second transistor form a second driver to operate in a second mode of operation.

2. The apparatus of claim 1, wherein the second pull-up transistor is operable to be turned off in the first mode of operation in which the first pull-up transistor is turned on.

3. The apparatus of claim 1, wherein the second pull-up transistor is operable to be turned on in the second mode of operation in which the first pull-up transistor is turned off.

4. The apparatus of claim 1, wherein the first transistor and the first pull-up transistor are p-type devices.

5. The apparatus of claim 1, wherein the second transistor and the pull-down transistor are n-type devices.

6. The apparatus of claim 1, wherein the first power supply is substantially 3.3V and the second power supply is in the range of 0.5V to 1.2V.

7. The apparatus of claim 1, wherein the second pull-up transistor is a p-type device.

8. The apparatus of claim 1, wherein the first driver is a USB compliant high speed (HS) driver for lower power operation, the second driver is a USB compliant classic (CL) driver for higher power operation.

9. A driver comprising:
a first pull-up transistor coupled to a first power supply, the first pull-up transistor controllable by a first pre-driver;
a second pull-up transistor coupled to a second power supply, the second pull-up transistor controllable by a second pre-driver;
first and second transistors coupled in series and coupled to a first bias signal and a first pad, the first and second transistors separating the first pull-up transistor from the second pull-up transistor, the first transistor coupled to the first pull-up transistor and the second transistor coupled to the second pull-up transistor; and
a first pull-down transistor coupled to the second pull-up transistor,
wherein the first pull-up transistor, the first and second transistors and the pull-down transistor form a first driver to operate in a first mode of operation, and the second pull-up transistor, the pull-down transistor and the second transistor form a second driver to operate in a second mode of operation.

10. The driver of claim 9, wherein the second pull-up transistor is operable to be turned off in the first mode of operation in which the first pull-up transistor is turned on.

11. The driver of claim 9, wherein the second pull-up transistor is operable to be turned on in the second mode of operation in which the first pull-up transistor is turned off.

12. The driver of claim 9, wherein the first power supply is greater than the second power supply.

13. The driver of claim 9, wherein the first pull-up transistor, second pull-up transistor, first and second transistors, and first pull-down transistor are part of a USB transmitter.

14. The driver of claim 8 further comprises:
a third pull-up transistor coupled to the first power supply, the third pull-up transistor controllable by a third pre-driver;
a fourth pull-up transistor coupled to the second power supply, the fourth pull-up transistor controllable by a fourth pre-driver;
third and fourth transistors coupled in series and coupled to a second bias signal and a second pad, the third and fourth transistors separating the third pull-up transistor from the fourth pull-up transistor; and
a second pull-down transistor coupled to the second pull-up transistor.

15. The driver of claim 14, wherein the first and third pull-up transistors, second and fourth pull-up transistors, first, second, third, and fourth transistors, and first and second pull-down transistors are part of a differential USB transmitter.

16. The driver of claim 14, wherein the first and second pads output differential output signals.

17. The driver of claim 9, wherein the first power supply is substantially 3.3V and the second power supply is in the range of 0.5V to 1.2V.

18. The driver of claim 9, wherein the first driver is a USB compliant high speed (HS) driver for lower power operation, and the second driver is a USB compliant classic (CL) driver for higher power operation.

19. A driver comprising:
a first pull-up transistor coupled to a first power supply, the first pull-up transistor controllable by a first pre-driver;
a second pull-up transistor coupled to a second power supply, the second pull-up transistor controllable by a second pre-driver;
first and second transistors coupled in series between the first pull-up transistor and the second pull-up transistor and coupled to a first bias signal and a first pad;
a first pull-down transistor coupled to the second pull-up transistor;
a third pull-up transistor coupled to the first power supply, the third pull-up transistor controllable by a third pre-driver;
a fourth pull-up transistor coupled to the second power supply, the fourth pull-up transistor controllable by a fourth pre-driver;
third and fourth transistors coupled in series between the third pull-up transistor and the fourth pull-up transistor and coupled to a second bias signal and a second pad; and
a second pull-down transistor coupled to the second pull-up transistor.

20. The driver of claim 19, wherein the first and third pull-up transistors, second and fourth pull-up transistors, first, second, third, and fourth transistors, and first and second pull-down transistors are part of a differential USB transmitter.

* * * * *